United States Patent [19]
Sakata

[11] 4,021,648
[45] May 3, 1977

[54] FUNCTION GENERATOR AND APPLICATION THEREOF

[75] Inventor: Kunihiro Sakata, Kanagawa, Japan

[73] Assignee: Hitachi, Ltd., Japan

[22] Filed: Aug. 22, 1975

[21] Appl. No.: 607,036

[30] Foreign Application Priority Data

Aug. 28, 1974 Japan ............................ 49-97957
June 21, 1974 Japan ............................ 49-70219

[52] U.S. Cl. ......................... 235/150.53; 235/189; 235/198; 340/347SY

[51] Int. Cl.² ..................... G06J 1/00; H03K 13/02

[58] Field of Search ............ 235/150.53, 186, 189, 235/197, 198; 340/347 DA, 347 SY; 328/14

[56] References Cited

UNITED STATES PATENTS

| | | | |
|---|---|---|---|
| 3,566,393 | 2/1971 | Girault et al. | 340/347 DA |
| 3,675,234 | 7/1972 | Metz | 340/347 DA |
| 3,688,098 | 8/1972 | Cwynar et al. | 235/186 |
| 3,728,719 | 4/1973 | Fish | 340/347 SY |
| 3,806,917 | 4/1974 | Gronner et al. | 340/347 SY |
| 3,832,707 | 8/1974 | Buchanan et al. | 340/347SY |

FOREIGN PATENTS OR APPLICATIONS

| | | | |
|---|---|---|---|
| 1,498,194 | 9/1969 | Germany | 235/186 |

*Primary Examiner*—Felix D. Gruber
*Attorney, Agent, or Firm*—Craig & Antonelli

[57] ABSTRACT

A first function generator adapted to be digitally supplied with an angular signal $\phi$ at an input thereof and produce two types of functions, the ratio of which is approximate to tan $\phi$, is series-connected with a second function generator for correcting a variation depending on the angular signal in the vector length of vectors having the two types of functions as their orthogonal components, whereby functions approximating cos $\phi$ and sin $\phi$ or the vectors of a substantially constant vector length are produced at the output of the first function generator.

7 Claims, 16 Drawing Figures

FUNCTION GENERATOR AND APPLICATION THEREOF

BACKGROUND OF THE INVENTION

1. Field of the Invention

The present invention relates to a function generator which is supplied with an angular signal and produces function sin $\phi$ and cos $\phi$ or a function closely approximating a circular function. (In the case that a pair of functions $X = f_1(\phi)$ and $Y = f_2(\phi)$ are plotted along the X and Y axes of a rectangular coordinate system, if the locus of any pair of coordinates (X, Y) falls on a circle when the angle $\phi$ is linearly varied, the functions $X = f_1(\phi)$ and $Y = f_2(\phi)$ are referred to as circular functions in the present application).

2. Description of the Prior Art

In the hitherto known digital resolver converter or the like, a circuit which is supplied with an angular signal in a digital form and produces as an output a resolver signal in an analog form has been employed. For better understanding of the invention, a brief description will first be made of general arrangements and features of the heretofore known circuits employed for the digital resolver converter by referring to FIGS. 1 to 4.

FIG. 1 shows schematically a typical function generator employed for the digital resolver converter or the like. It is assumed that the function generator I shown in FIG. 1 is supplied with an angular signal $\phi$ of a digital quantity, whereby there appears at an output terminal 3 a function signal expressed by $$X = f_1(\phi) . Es \quad (1)$$

and at the other output the function is given by the following expression:

$$Y = f_2(\phi) . Es \quad (2)$$

The angular signal $\phi$ applied to the input terminal 2 in a digital form comprising bits $a_0, a_1, a_2, \ldots, a_n$. The range in which the angular quantity applied to the input is varied is assumed to be 0° to 90°, that is, within the first quadrant for the convenience' sake of the explanation. Further, it is also assumed that the weighting of the individual bits is made in accordance with the binary notation in a manner defined by the following expression:

$$\phi = (a_0 \times 2^0 + a_1 \times 2^{-1} + a_2 \times 2^{-2}, \ldots a_n \times 2^{-n}) \times 45° \quad (3)$$

The range of $\phi$ given by the above expression (3) is of 0° to 90° × $(1 - 2_n^{-1})$.

By selecting $n$ to be a sufficiently great number, $\phi$ can cover substantially the whole range from 0° to 90°.

Reference numeral 5 indicates an input terminal for a reference signal Es required to generate the analog function. Application of the reference signal Es at the input terminal results in the generation of products of desired functions and Es at the outputs. In the case of the digital resolver converter or the like, an alternating current signal required for the excitation of the resolver is used as the reference signal Es. In other applications, a direct current signal may be used for the reference signal.

If the functions $f_1(\phi)$ and $f_2(\phi)$ having the following relation:

$$\frac{f_2(\phi)}{f_1(\phi)} \approx \tan \phi \quad (4)$$

can be produced by the function generator 1, with a practically tolerable accuracy from the engineering viewpoint, the output signals X and Y may be satisfactorily utilized as the resolver signals. In this connection, it is noted that, even if the conditions that $f_1(\phi) \propto \cos \phi$ and $f_2(\phi) \propto \sin \phi$ are not always satisfied, the receiver servo system supplied with the above resolver signals X and Y can be operated normally, so far as the relation (4) is met, and the angular signal $\phi$ can be accepted with a practically tolerable accuracy.

As an example of such a function, the following functions $$f_1(\phi) = \frac{K' (90° - \phi)}{1 + K (90° - \phi)} \quad (5)$$

and $$f_2(\phi) = \frac{K' \phi}{1 + K \cdot \phi} \quad (6)$$

have been already reported in the periodical "ELECTRONIC DESIGN", Vol. 18, No. 7, Apr. 1, 1970, p. 56.

FIG. 2 shows a vector defined by the functions produced by the function generator shown in FIG. 1. The function $f_1(\phi)$ defined by the expression (5) is taken along the abscissa, while $f_2(\phi)$ satisfying the expression (6 ) is taken along the ordinate. In this case, the length of vector R and the angle $\theta$ can be, respectively, given by the following formulas:

$$R = \sqrt{f_1^2(\phi) + f_2^2(\phi)} \quad (7)$$

$$\theta = \tan^{-1} \frac{f_2(\phi)}{f_1(\phi)} \quad (8)$$

If the constant K appearing in the formulas (5) and (6) is selected so that $$K = 0.00617 \quad (9)$$

and K' is so selected that R becomes equal to 1 when $\phi = 0$, the vector length R will be varied in a manner shown in FIG. 3 as the signal $\phi$ varies from 0° to 90°.

Further, if the term $$\frac{f_2(\phi)}{f_1(\phi)}$$

of the expression (4) becomes ideally equal to tan $\phi$, the term $\phi$ of the expression (8) becomes equal to $\phi$. However, in reality, the above condition can not be realized, and there arises an inevitable error between $\theta$ and $\phi$, which error will be varied in dependence on the values of the angle $\phi$ as is illustrated in FIG. 4.

When the functions given by the expressions (5) and (6) are utilized as X-axis signal and Y-axis signals, the angular error of the vector of these function signals is in the order of 0.032° at maximum as can be seen from FIG. 4. Such errors lie in a tolerable range from the engineering viewpoint and hence the above functions can be satisfactorily utilized for the digital resolver converter and the digital synchro converter in practice.

The length of vector should ideally be constant independently from the angular signal $\phi$. However, the vector length is decreased about 14 % at maximum at 45° as is illustrated in FIG. 3. Although such variation may be tolerated in the case of the digital resolver converter or the like under certain circumstances, it can be allowed in the other applications such as display devices or the like.

As will be appreciated from the foregoing discussion, the function generator which can produce the functions defined by the expressions (5) and (6) has a drawback that the vector length of the functions is subjected to variations in dependence upon the angular values and therefore can not be called an ideal circular function generator. In other words, the functions expressed by the formulas (5) and (6) will certainly satisfy the condition given by the expression (4) in respect of the angular value with a high accuracy. These functions, however, are not proportional to cos $\phi$ and sin $\phi$ and for this reason incurs a result that the vector length will not remain constant.

BRIEF DESCRIPTION OF THE DRAWINGS

FIG. 1 shows schematically an example of a function generator employed hitherto for conventional digital resolver converter or the like.

SUMMARY OF THE INVENTION

The present invention is intended to eliminate the above described disadvantages and contemplates as a first object the provision of a function generator apparatus comprising a firt function generator which is supplied with an angular signal $\phi$ to generate at the outputs thereof functions $$f_1(\phi) = \frac{K'(90° - \phi)}{1 + K(90° - \phi)} \text{ and } f_2(\phi) = \frac{K'(\phi)}{1 + K(\phi)}$$

or modifications thereof in which K and K' are given constants and $f_2(\phi)/f_1(\phi)$ is substantially equal to tan $\phi$ with a tolerable accuracy, wherein a second function generator for generating a function closely approximating the function $1 / \sqrt{f_1^2(\phi) + f_2^2(\phi)}$ is connected in series with the first function generator, to thereby obtain at the outpus of the apparatus the functions approximating to cos $\phi$ and sin $\phi$ or circular functions substantially insusceptible to the variation in the vector length thereof.

A second object of the invention is to obtain functions approximating to cos $\phi$ and sin $\phi$ or circular functions having a vector length subjected to little variation by employing as the vector length correcting function the function $$1 + \frac{B\phi}{1 + A\phi}$$

or $$1 + \frac{B(90° - \phi)}{1 + A(90° - \phi)}$$

wherein A and B are given constants or a modification thereof.

A third object of the invention is to realize a sine or cosine function or a circular function with a high accuracy by a circuit of a relatively simplified construction.

Another object of the invention is to provide a digital resolver or digital synchroconverter, the outputs of which is substantially made immune to the variation in the vector length by by employing the above described function generator.

A further object of the invention is to provide a display apparatus which can easily produce a circle with the aid of the function generator according to the invention.

To accomplish the above-mentioned objects of the invention, there is proposed according to the invention a further generator circuit for correcting the variation in the vector length by utilizing the variation in the angular signal as a variable, which circuit is connected in series with the function generator of the type hereinbefore described, to thereby maintain the vector length as constant as possible.

Figure 3:
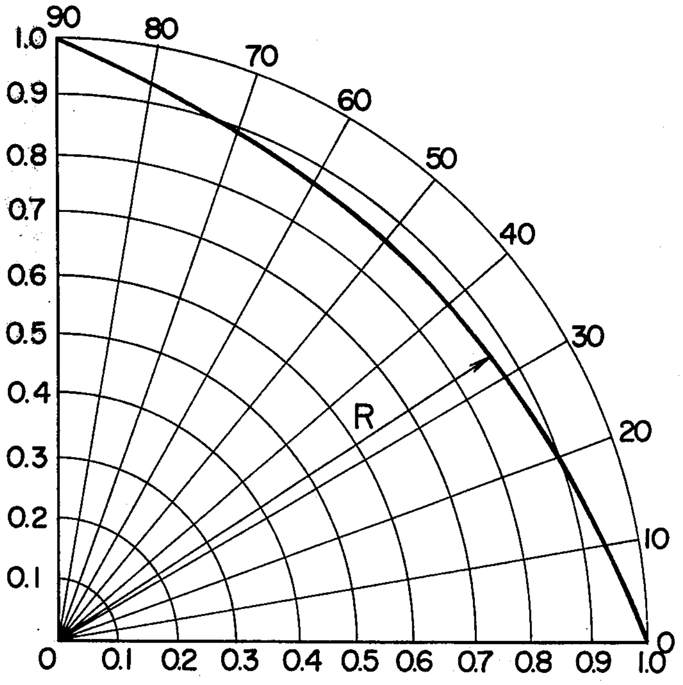
FIG. 3 PRIOR ART
FIG. 3 shows graphically a variation of the vector length of the functions produced by the conventional generator such as shown in FIG. 1.
Figure 5:
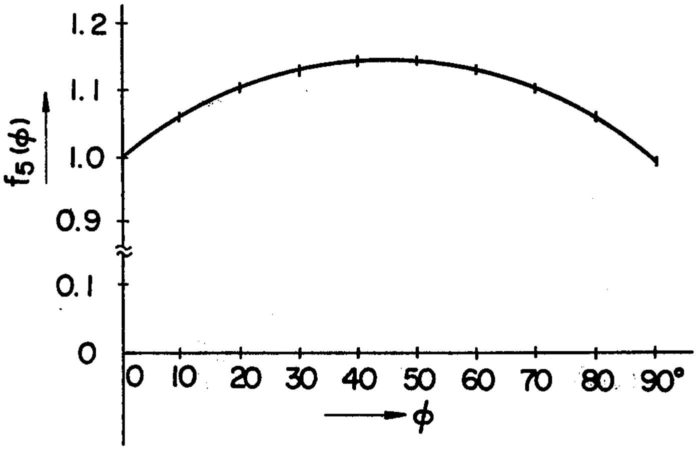
FIGS. 5 and 6 show graphically examples of correcting function for correcting or compensating the variation in the vector length according to the invention.
Figure 6:
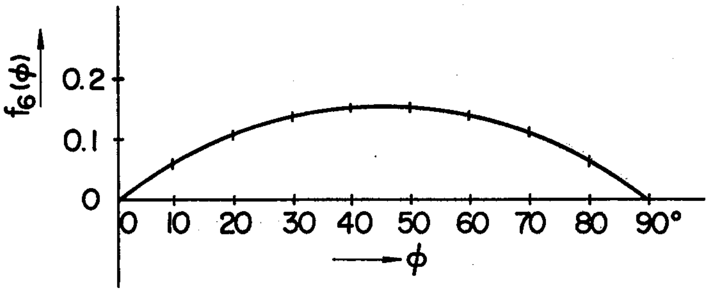

FIGS. 5 and 6 graphically show examples of the correction function for correcting or compensating the variation in the vector length. At this point, it should be recalled that the vector length of the functions $f_1(\phi)$ and $f_2(\phi)$ expressed by the formulas (5) and (6) can be given by the formula (7) and undergoes the variation such as shown in FIG. 3 in dependence on the variation of $\phi$ when K = 0.00617.

Starting from the above recognition, according to the invention, a function $f_5(\phi)$ which together with the function given by the formula (7) can produce a constant product is employed. This function $f_5(\phi)$ can be expressed as follows:

$$f_5(\phi) \cdot \sqrt{f_1^2(\phi) + f_2^2(\phi)} = 1 \quad (10)$$

or $$f_5(\phi)=\frac{1}{\sqrt{f_1^2(\phi)+f_2^2(\phi)}} \quad (11)$$

When the above function $f_5(\phi)$ is graphically represented with K equal to 0.00617, it takes a form such as shown in FIG. 5. In this connection, the constant K' is so selected that $f_5(\phi)$ becomes equal to 1 when $\phi$ is zero.

Figure 7:
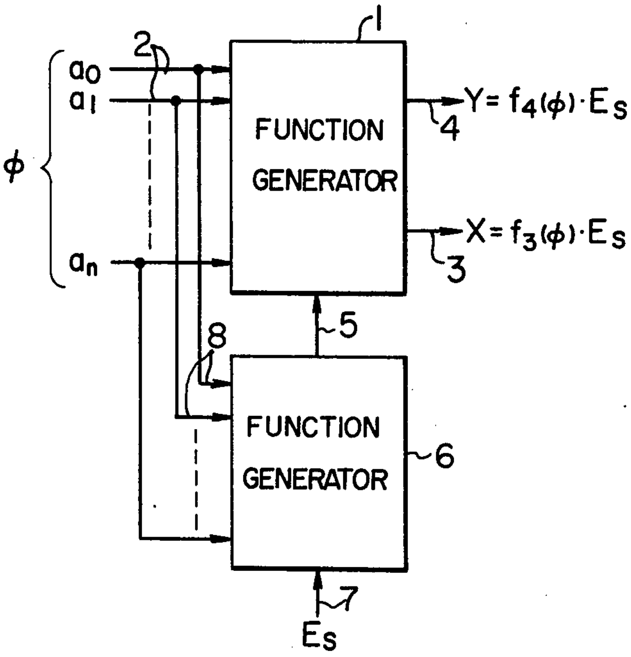
FIG. 7 is a block diagram showing schematically a general arrangement of a function generator according to an embodiment of the invention.

A function generator 6 which can produce a function approximating the function shown in FIG. 5 is connected in series with the hereinbefore described function generator 1 at the reference signal input terminal thereof as is shown in FIG. 7.

The function generator 6 is externally applied with the angular signal $\phi$ in a digital form at the input terminal 8 and additionally supplied with a reference signal Es at another input terminal 7.

The function generator 6 thus produces at the output thereof a product of a function approximating the formula (11) and the reference signal Es. When the output product is supplied to the function generator 1, the latter will produce at the function outputs 3 and 4 the signals which approximate the following functions (12) and (13) multiplied by Es. Namely, $$f_3(\phi)=f_5(\phi)\cdot f_1(\phi)=\frac{1}{\sqrt{f_1^2(\phi)+f_2^2(\phi)}}\cdot f_1(\phi) \quad (12)$$

$$f_4(\phi)=f_5(\phi)\cdot f_2(\phi)=\frac{1}{\sqrt{f_1^2(\phi)+f_2^2(\phi)}}\cdot f_2(\phi) \quad (13)$$

If the above functions are represented in a vector diagram with $f_3(\phi)$ taken along the X-axis and $f_4(\phi)$ along the Y-axis, the length of the vector is determined in the following manner:

$$\sqrt{f_3^2(\phi)+f_4^2(\phi)}$$

$$=\sqrt{\left(\frac{f_1(\phi)}{\sqrt{f_1^2(\phi)+f_2^2(\phi)}}\right)^2+\left(\frac{f_2(\phi)}{\sqrt{f_1^2(\phi)+f_2^2(\phi)}}\right)^2}$$

$$=\sqrt{\frac{f_1^2(\phi)+f_2^2(\phi)}{f_1^2(\phi)+f_2^2(\phi)}}=1 \quad (14)$$

This means that the vector length is constant.

On the other hand, the angle $\theta$ can be determined as follows:

$$\theta=\tan^{-1}\left\{\frac{f_4(\phi)}{f_3(\phi)}\right\}=\tan^{-1}\left\{\frac{f_5(\phi)\cdot f_2(\phi)}{f_5(\phi)\cdot f_1(\phi)}\right\}$$

$$=\tan^{-1}\left\{\frac{f_2(\phi)}{f_1(\phi)}\right\} \quad (15)$$

Figure 4:
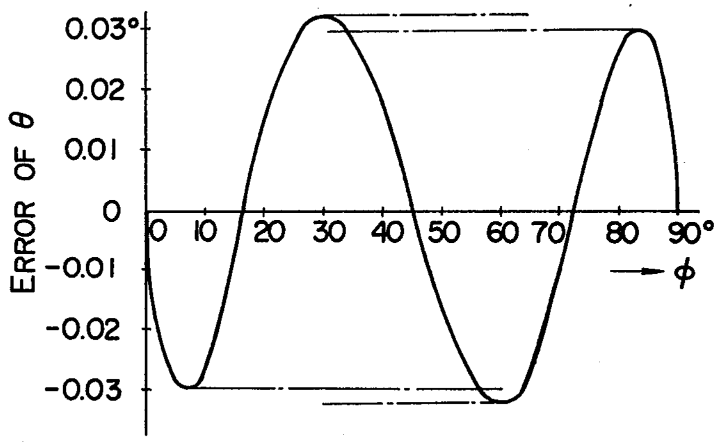
FIG. 4 illustrates angular errors of the same.

It will thus be understood that the result is the same as the hereinbefore mentioned formula (8) and errors can be represented in the same form as the one shown in FIG. 4.

In this way, the vector length can be made constant by connecting the vector length correcting function generator 6 to the reference input of the function generator 1.

Now, a circuit arrangement of the function generator 6 will be described. The function to be generated by the generator 6 must be the one given by the formula (11), which takes a form shown in FIG. 5 when graphically represented after numerical computation with K = 0.00617. K' is so selected that $f_5(\phi)$ is equal to 1 when $\phi = 0$. As can be seen from FIG. 5, the function $f_5(\phi)$ is symmetrical along the abscissa about the point corresponding to 45°, which means that the circuit capable of generating the function in the range of 0° to 45° can also easily generate the function in the range beyond the point corresponding to 45°. For the production of such a function, one generally resorts to a principle of linear segment approximation. However, in accordance with the present invention, a method is provided in which, when the angle $\phi$ applied in digital form is varied linearly, the function generator 6 produces an output, in analog form, having a continuous, curved characteristic.

The function shown in FIG. 5 takes values of 1 at 0° and 90° and the values greater than 1 between 0° and 90°, exclusive. Accordingly, the function $f_5(\phi)$ may be expressed as follows:

$$f_5(\phi) = 1 + f_6(\phi) \quad (16)$$

The function $f_6(\phi)$ will then take a profile shown in FIG. 6 which corresponds to the form of $f_5(\phi)$ subtracted by 1 therefrom.

In the range from 0° to 45°, the function shown in FIG. 6 can be approximated by the following function:

$$f_7(\phi)=\frac{B\phi}{1+A\phi} \quad (17)$$

On the other hand, in the range from 45° to 90°, the function $f_6(\phi)$ can be approximated by the function $$f_8(\phi)=\frac{B(90°-\phi)}{1+A(90°-\phi)} \quad (18)$$

which is symmetrical to the function $f_7(\phi)$ about the point of 45°. In the formulas (17) and (18), A and B represent constants.

Accordingly, in the range from 0° to 45°, $$f_5(\phi)\approx 1+f_7(\phi)=1+\frac{B\phi}{1+A\phi} \quad (19)$$

while in the range of 45° to 90°, $$f_5(\phi)\approx 1+f_8(\phi)=1+\frac{B(90°-\phi)}{1+A(90°-\phi)} \quad (20)$$

The formulas (19) and (20) do not perfectly coincide with the formula (11). However, if a certain degree of error is tolerated, the former approximates the latter with a reasonable accuracy.

After the correction by the function $f_5$, the vector length of vectors defined by the functions $f_1(\phi)$ and $f_2(\phi)$ may be given by the following expressions:

$$Rh=\left(1+\frac{B\phi}{1+A\phi}\right)\sqrt{f_1^2(\phi)+f_2^2(\phi)} \quad (21)$$

when $0° \leq \phi < 45°$, and $$Rh = \left(1 + \frac{B\,(90° - \phi)}{1 + A\,(90° - \phi)}\right)\sqrt{f_1^2(\phi) + f_2^2(\phi)} \quad (22)$$

when $45° \leq \phi < 90°$.

The vector length Rh thus takes constantly the value substantially equal to 1 even if the angular signal $\phi$ is varied.

Figure 8:
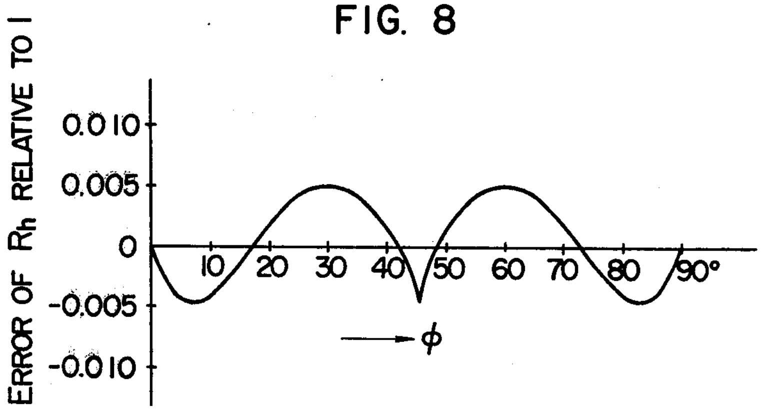
FIG. 8 shows exemplarily errors in the vector length after having been corrected according to the invention.

When errors of the functions expressed by the formulas (21) and (22) relative to 1 are calculated on the assumption that A=0.0314, B=0.00897, K=0.00617 and K'=0.01728, they may be graphically represented in a form such as shown in FIG. 8, from which it can be seen that the error is always smaller than 0.005.

Stated alternatively, it is possible to suppress the variation in the vector length less than 0.5 %, when the correction is made by the functions of the formulas (19) and (20) generated through the function generator 6. It will be noted that the error of 0.5 % is reasonably tolerable, although it depends on the practical applications.

Referring to FIG. 7, when the functions given by the formulas (5) and (6) are generated from the function generator 1, while the functions of the formulas (19) and (20 ) are produced by the function generator 6, there will appear at the function output terminals 3 and 4 the signals which can be expressed as follows:

$$X = \left(1 + \frac{B\phi}{1 + A\phi}\right) \cdot \frac{K' \cdot (90° - \phi)}{1 + K \cdot (90° - \phi)} \cdot E_s \quad (23)$$

$$Y = \left(1 + \frac{B\phi}{1 + A\phi}\right) \cdot \frac{K'\phi}{1 + K\phi} \cdot E_s \quad (24)$$

when $0° \leq \phi < 45°$, and $$X = \left(1 + \frac{B\,(90° - \phi)}{1 + A\,(90° - \phi)}\right) \cdot \left(\frac{K'\,(90° - \phi)}{1 + K\,(90° - \phi)}\right) \cdot E_s \quad (25)$$

$$Y = \left(1 + \frac{B\,(90° - \phi)}{1 + A\,(90° - \phi)}\right) \cdot \frac{K'\phi}{1 + K\phi} \cdot E_s \quad (26)$$

when $45° \leq \phi < 90°$.

These functions can be made highly proportional to cos $\phi$ and sin $\phi$ by selecting the constants A, B, K and K' at appropriate values. Further, a circular function having a vector length of negligible variation may be obtained, if the constants are suitably selected.

Next referring to FIGS. 9 and 10, a circuit arrangement of the function generator for producing the correcting functions given by the formulas (19) and (20) will be described in detail.

Figure 9:
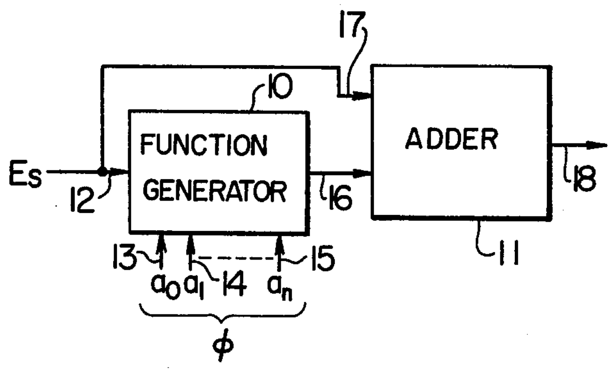
FIGS. 9 and 10 show more concretely a circuit arrangement of a function generator which is capable of correcting the error in the vector length according to the invention.

In FIG. 9, reference numeral 10 represents a function generator for producing functions such as given by the formulas (17) and (18). When the function generator 10 is supplied with a reference signal Es at the analog signal input terminal 12 together with an angular signal $\phi$ in a digital form comprising bits $a_0, a_1, \ldots a_n$ at the digital input terminals designated by reference numerals such as 13, 14 and 15, there will appear at the output terminal of the generator 10 the signal which can be expressed as follows:

$$\frac{B\phi}{1 + A\phi} \cdot E_s \quad (27)$$

when $0° \leq \phi < 45°$, and $$\frac{B\,(90° - \phi)}{1 + A\,(90° - \phi)} \cdot E_s \quad (28)$$

when $45° \leq \phi < 90°$.

This output signal is then applied to the input 16 of an added 11 and added to the signal Es applied to the input terminal 17. The adder 17 will then produce at the output terminal 18 the output signal which can be expressed by the following formulas (29) and (30) and corresponds to the function defined by the formulas (19) and (20).

$$\left(1 + \frac{B\phi}{1 + A\phi}\right) E_s \quad (29)$$

when $0° \leq \phi < 45°$, and $$\left(1 + \frac{B\,(90° - \phi)}{1 + A\,(90° - \phi)}\right) E_s \quad (30)$$

when $45° \leq \phi < 90°$.

Figure 10:
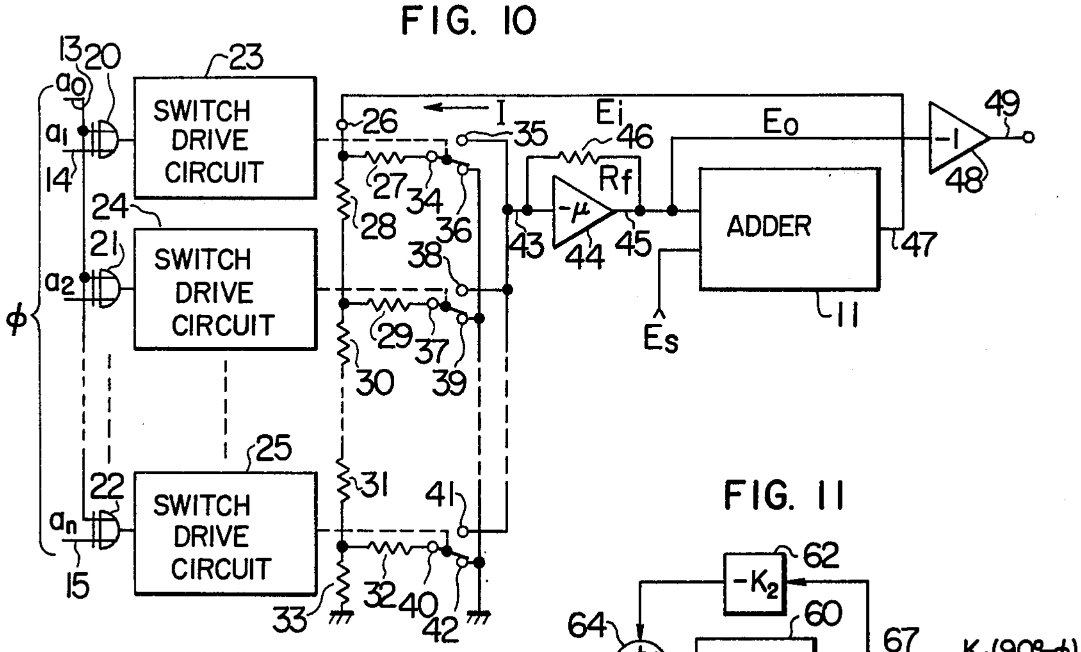

FIG. 10 shows an exemplary a circuit configuration in detail of the function generator 10 for producing the functions given by the formulas (27) and (28).

Referring to FIG. 10, the digital angular signal $\phi$ is applied to angular signal input terminals indicated by such reference numerals as 13, 14 and 15 as digital bits $a_0, a_1, a_2, \ldots, a_n$. These angular bit signals are supplied to switch drive circuits indicated by such numerals as 23, 24 and 25 through exclusive OR gates indicated by such numerals as 20, 21 and 22. The switch drive circuits 23, 24 and 25 have respective movable contacts 34, 37 and 40 to be driven. The change-over of these switches must be effected by $\phi$ when the angular signal is in the range of 0° to 45° and by $(90° - \phi)$ in the range of 45° to 90° of the angular signal. Such a selection is performed by the exclusive OR gates 20, 21 and 22.

In case the angular signal $\phi$ is composed of the bit signal $a_0, a_1, \ldots . a_n$ in the relation defined by the formula (3), the most significant bit $a_0$ is always logic 0 when $0° \leq \phi < 45°$. Accordingly, the angular signal $\phi$ in this range can be expressed by the following formula (31).

$$\phi = (a_1 \times 2^{-1} + a_2 \times 2^{-2} + , \ldots . + a_n \times 2^{-n}) \times 45° \quad (31)$$

The most significant bit $a_0$ is always logical 1 when $45° \leq \phi < 90°$. Thus, the angular signal $\phi$ in this range can be expressed by the following formula (32).

$$\phi = 45° + (a_1 \times 2^{-1} + a_2 \times 2^{-2} + , \ldots . + a_n \times 2^{-n}) \times 45° \quad (32)$$

In this connection, $$90° - \phi = 90° - 45° - (a_1 \times 2^{-1} + a_2 \times 2^{-2} +, \ldots . + a_n \times 2^{-n}) \times 45° = \{1 - (a_1 \times 2^{-1} + a_2 \times 2^{-2} +, \ldots . , + a_n \times 2^{-n})\} \times 45° \quad (33)$$

Obviously, the expression (33) is a complement of the expression (31). In this manner, the above mentioned individual switches can be driven by the bit signals $a_1, a_2, \ldots . a_n$ when $0° \leq \phi < 45°$ and by the complements thereof when $45° \leq \phi < 90°$. Since the circuit for producing the complement signal is somewhat complicated and does not constitute an important part of the invention, a signal composed of negated bits of the individual bits can be substituted for the complement signal. In case the number of bits is sufficiently great, the substituted signal and complement signal take considerably approximated values and involve substantially no problem in practice.

In view of the above principle, the individual switches are driven by the negated bit signals $\overline{a_1}, \overline{a_2}, \ldots, \overline{a_n}$ when $45° \leq \phi < 90°$. When $a_0$ is 0 or $0° \leq \phi < 45°$, signals $\overline{a_1}, \overline{a_2}, \ldots \overline{a_n}$ will appear at the outputs of the exclusive OR gates such as 20, 21 and 22, while the signals $a_1, a_2, \ldots a_n$ make an appearance when $a_0$ is 1.

It is assumed that the movable contact 34 of the switch is connected to a contact 35 when $a_0$ is 0 and $a_1$ is 1 or alternatively $a_0$ is 1 and $a_1$ is 0, while the contact 34 is connected to another contact 36 when both $a_0$ and $a_1$ are 0s or alternatively $a_0$ and $a_1$ are both 1s.

It is noted that the movable contacts 34, 37 and 40 of the individual switches are connected to resistors 27, 29 and 32 each having resistance of 2R, the other ends of these resistors are interconnected to one another through resistors 28, 30 and 31 of resistance R and grounded through a resistor 33 of a resistance value 2R. The contacts 36, 39 and 42 of the individual switches are grounded, while the other contacts 35, 38 and 41 are connected altogether to the input of an amplifier 44.

When a voltage $E_1$ is applied to an analog signal input point 26 in the above described resistorswitch network of R – 2R ladder type, current I will flow through the circuit point 26, wherein $$I = E_i/R \tag{34}$$

Current $I_t$ at a circuit point 43 after having flown through the resistor-switch network of the R – 2R ladder type is determined as follows:

$$I_t = (a_1 \times 2^{-1} + a_2 \times 2^{-2} +, \ldots + a_n \times 2^{-n})I \tag{35}$$

when $0° \leq \phi < 45°$, and $$I_t = (\overline{a_1} \times 2^{-1} + \overline{a_2} \times 2^{-2} +, \ldots + \overline{a_n} \times 2^{-n})I \tag{36}$$

when $45° \leq \phi < 90°$.

Current $I_t$ is applied to the amplifier 44 which can be a phase-inversion type having an amplification factor and an input impedance of relatively great values. The amplifier 44 is provided with a feed-back path extending from the output 45 thereof through a resistor 46 of a resistance value $R_f$.

With such a circuit arrangement, the amplifier 44 can produce an output voltage $E_o$ having the following relation:

$$E_o = -I_t \cdot R_f \tag{37}$$

The output voltage $E_o$ and the reference analog signal Es are added together by an adder 11 and the resulting signal is fed back to the analog signal input point 26, whereby the following relation (38) can be established. Namely, $$E_i = C \cdot E_o \times D \cdot Es \tag{38}$$

wherein C and D represent additional constants. From the expressions (34), (35), (36), (37) and (38), the following expressions (39) and (40) can be derived.

$$E_o = -\frac{(a_1 \times 2^{-1} + a_2 \times 2^{-2} +, \ldots, a_n \times 2^{-n})\frac{R_f}{R} \cdot D}{1 + (a_1 \times 2^{-1} + a_2 \times 2^{-2} +, \ldots, + a_n \times 2^{-n})\frac{R_f}{R} \cdot C} \cdot E_s \tag{39}$$

when $0° \leq \phi < 45°$, and $$E_o = -\frac{\left(\overline{a_1} \times 2^{-1} + \overline{a_2} \times 2^{-2} +, \ldots, + \overline{a_n} \times 2^{-n}\right)\frac{R_f}{R} \cdot D}{1 + \left(\overline{a_1} \times 2^{-1} + \overline{a_2} \times 2^{-2} + \cdot \ldots, + \overline{a_n} \times 2^{-n}\right)\frac{R_f}{R} \cdot C} \cdot E_s \tag{40}$$

when $45° \leq \phi < 90°$.

If the angular signals are replaced by $\phi$ and $(90 - \phi)$, the expressions (39) and (40) may be rewritten as follows:

$$E_o = -\frac{\frac{R_f}{R} \cdot D \cdot \frac{\phi}{45°}}{1 + \frac{R_f}{R} \cdot C \cdot \frac{\phi}{45°}} \cdot E_s \tag{41}$$

when $0° \leq \phi < 45°$, and $$E_o = -\frac{\frac{R_f}{R} \cdot D \cdot \frac{1}{45°}(90° - \phi)}{1 + \frac{R_f}{R} \cdot C \cdot \frac{1}{45°}(90° - \phi)} \cdot E_s \tag{42}$$

when $45° \leq \phi < 90°$.

When the terms $$\frac{R_f}{R} \cdot D \cdot \frac{1}{45°} \text{ and } \frac{R_f}{R} \cdot C \cdot \frac{1}{45°}$$

are replaced by B and A, respectively, with signs inverted, one can obtain the functions given by the formulas (27) and (28).

In this manner, by inverting the phase of the signal voltage $E_o$ through the phase-inverter amplifier 48 having a gain of 1, the desired function signal can be produced at the output 49 of the amplifier 48. Desired values for the constants A and B can be attained by selecting R, $R_f$, C, D etc. at appropriate allowable values in the design of the circuit.

In the foregoing description, it has been assumed that the angular signal $\phi$ lies restrictively in the range corresponding to the first quadrant of 0° to 90°. However, it will be self-explanatory that the range of the angular signal $\phi$ can be easily expanded to the quadrant greater than 90° by changing over the polarity or sign of the signal and/or by exchanging the types of functions.

It has now become apparent that, according to the invention, the sine or cosine function or a circular function can be generated with a high accuracy by a circuit of a simplified arrangement. When the functions given by the formulas (19) and (20) are employed as the correcting functions, the correction of the variation in the vector length of the concerned functions can be advantageously carried out by a resistance-switch network of the R – 2R ladder type which is commercially easily available. Further, the function generator according to the invention can be utilized to construct the digital resolver or digital synchro converters which are substantially immune to the variation in the vector length. Further, the inventive function generator can be employed in a display apparatus to generate a circle.

It will further be noted that the term ($90° - \phi$) of the functions given by the formulas (5), (18), (20) etc. is not always to be strictly satisfied, and other forms may be used for this term if they are in the allowable range pof accuracy from the engineering viewpoint. For example, in case the angular signal $\phi$ is available in a digital form, the term ($90° - \phi$) may be replaced by the negation of the bits of the signal $\phi$. The weighting may also be made in another manner. The numerical value 90° is not necessarily to be strictly interpreted. The values approximating 90° are equally useful in carrying out the invention. The correcting functions represented by the formulas (19) and (20) may take modified forms. The various constants need not be the predetermined ones. They can be of any values, so far as the desired accuracy can be attained. Besides, the function generator 6 for producing the correcting functions as described above with reference to FIG. 7 may be connected in series to the output terminal of the function generator 1 rather than to the analog reference signal input thereof. Further, the angular signal $\phi$ need not be a digital signal. It may be another type of signal depending on the arrangement of the function generator.

Next, other embodiments of the function generator according to the invention as well as applications thereof will be described by referring to FIGS. 11 to 14.

Figure 11:
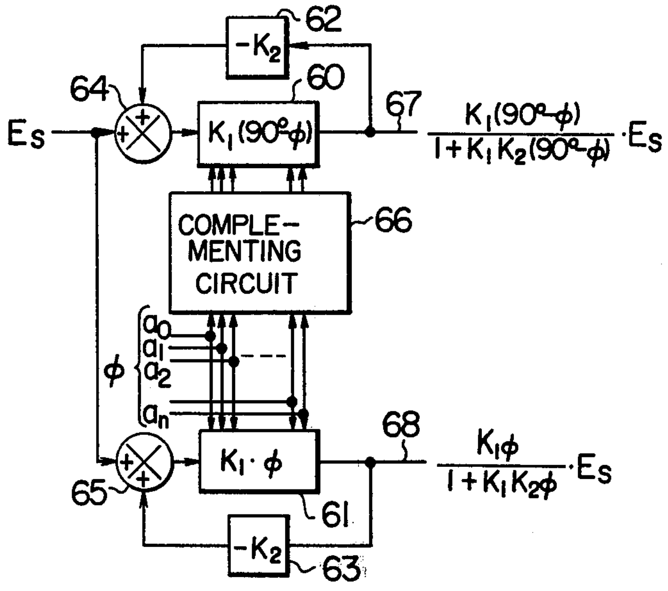
FIG. 11 is a block diagram showing in detail a function generator shown in FIG. 1.

FIG. 11 shows a detailed construction of the function generator adapted to produce the functions defined by the formulas (5) and (6). In this figure, reference numerals 60 and 61 denote D-A converters of a multiplier type which produce at the outputs thereof the products of input analog signal and digital signal. The D-A converters 60 and 61 are provided with respective feedback paths comprising, respectively, scale-factor elements 62 and 63 of a sign or polarity inverting type. The output from the scale-factor elements 62 and 63 are added to a reference analog input signal $E_s$ at the adders 64 and 65, the outputs from which constitute inputs to the D-A converters of the multiplier type 60 and 61, respectively.

Each of the D-A converters 60 and 61 is supplied with angular signals $\phi$ and ($90° - \phi$) in a digital form of the binary notation at the digital input terminals. The signal (90° − 100 ) can be obtained by complementary $\phi$ through a complementing circuit 66 shown in FIG. 11.

With the circuit arrangement as described above, a function in a form of $$\frac{K_1 (90° - \phi)}{1 + K_1 \cdot K_2 (90° - \phi)} \cdot E_s$$

can be obtained at the output 67 of the multiplier type D-A converter 60, while there appears at the output 68 of the converter 61 the signal representing the following function:

$$\frac{K_1\phi}{1 + K_1 K_2 \phi} \cdot E_s$$

In the above functions, $K_1$ is a multiplication constant of the D-A converters and $K_2$ is a constant of the scale-factor elements.

Figure 1:
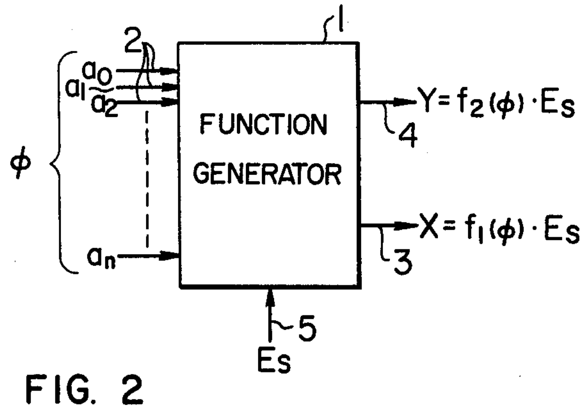
Figure 2:
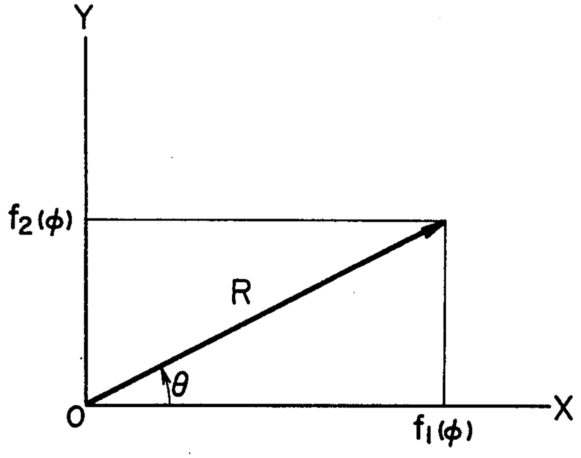
FIG. 2 shows a vector diagram of the functions produced by the function generator shown in FIG. 1.

It will be appreciated that, when the product $K_1 . K_2$ is replaced by the constant K of the formulas (5) and (6) with $K_1$ replaced by K′, the functions defined by these formulas can be obtained at the output 67 and 68 of the D-A converters 60 and 61. In this way, the function generator shown in FIG. 1 may be constructed in the circuit configuration shown in FIG. 11.

Figure 12:
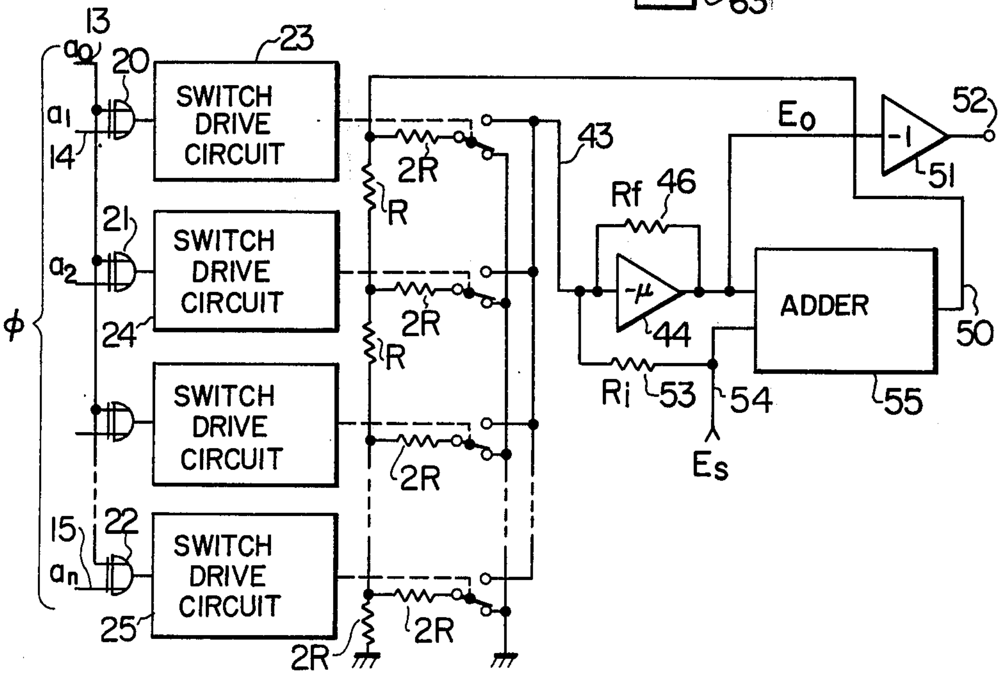
FIG. 12 is a circuit diagram of another embodiment of a vector length correcting function generator according to the invention.

For generating the functions defined by the aforementioned formulas (19) and (20), another system may be employed. The formulas (19) and (20) can be rewritten in the following forms:

$$f_s(\phi) \approx 1 + \frac{B\phi}{1 + A\phi} = \frac{1 + (A + B)\,\phi}{1 + A\phi} \qquad (43)$$

when $0° \leq \phi < 45°$, and $$f_s(\phi) \approx 1 + \frac{B\,(90° - \phi)}{1 + A\,(90° - \phi)} = \frac{1 + (A + B)\,(90° - \phi)}{1 + A\,(90° - \phi)} \qquad (44)$$

when $45° \leq \phi < 90°$.

by using the above modified functions, it is possible to generate the functions to correct the vector length by means of a circuit much simplified than in the case of the functions of the formulas (19) and (20). An embodiment of such a circuit is shown in FIG. 12, which is substantially the same as one shown in FIG. 10 except that a resistor 53 having a resistance value $R_t$ is connected between the reference analog signal input terminal ($E_s$) and the input terminal 43 of the amplifier 44. When current $E_s/R_t$ is applied to the input 43 of the amplifier 44 by way of the resistor 53, the following relation can be established in place of the formula (37). Namely, $$E_o = -R_f\left(I_t + \frac{E_s}{R_t}\right) \qquad (45)$$

Thus, the formulas (41) and (42) can be modified as follows:

$$E_o = -\frac{\frac{R_f}{R_t} + \frac{R_f}{R}\cdot D \cdot \frac{\phi}{45°}}{1 + \frac{R_f}{R}\cdot C \cdot \frac{\phi}{45°}} \cdot E_s \qquad (46)$$

when $0° \leq \phi < 45°$, and $$E_o = -\frac{\frac{R_f}{R_t} + \frac{R_f}{R}\cdot D \cdot \frac{1}{45°}(90° - \phi)}{1 + \frac{R_f}{R}\cdot C \cdot \frac{1}{45°}(90° - \phi)} \qquad (47)$$

when $45° \leq \phi < 90°$.

If the selection is made so that $$R_t = R_f, \frac{R_f}{R}\cdot C \cdot \frac{1}{45°} = A \text{ and } \frac{R_f}{R}\cdot D \cdot \frac{1}{45°} = A + B$$

with the sign of the above functions inverted, one can obtain the functions as defined by the formulas (43) and (44).

In this manner, by inverting the phase of the signal $E_o$ through a phase-inverter amplifier 51 having a gain of 1 as is shown in FIG. 12, the vector length connecting functions are obtainable at the output 52 of the amplifier 51 in a much more simplified manner than the cases of FIGS. 9 and 10.

As practical applications of the function generators according to the invention, a digital resolver converter, digital synchro-converter or the like may be conceived. These converters have been described in the publications "CONTROL ENGINEERING", September, 1965, p. 99 and "ELECTRONIC DESIGN", Vol. 18, No. 6, March 15 to No. 9, Apr. 26, 1970.

Figure 13:
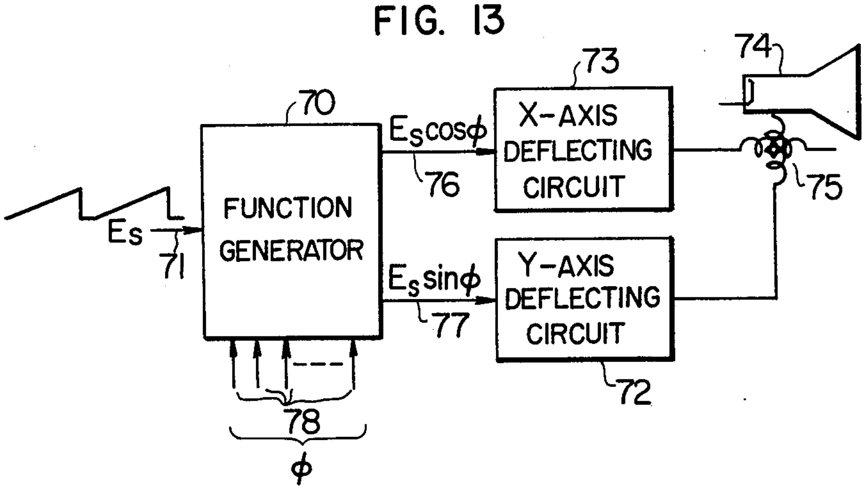
FIG. 13 is a block diagram of a display apparatus to which the function generator of the invention is applied.
Figure 14A:
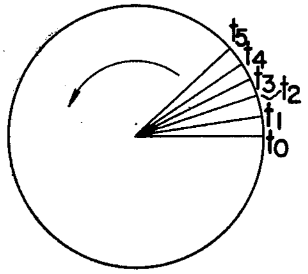
FIGS. 14*a* and 14*b* respectively show PPI and spiral images which can be produced by the apparatus shown in FIG. 13.
Figure 14B:
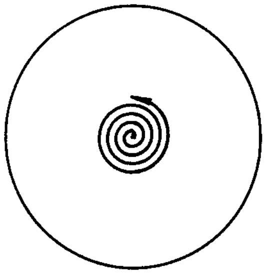

FIGS. 13 and 14 show a display apparatus to which the function generator is applied in order to generate a circle in the display. Referring to FIG. 13, numeral 70 denotes a circular function generator embodying the principle of the invention, which generator is adapted to produce at the outputs 76 and 77 the functions highly approximating $E_s \cdot \cos\phi$ and $E_s \cdot \sin\phi$, respectively, upon application of the analog signal $E_s$ at the analog input terminal 71 and the digital angular signal $\phi$ at the digital input terminal 78. The outputs 76 and 77 of the function generator 70 are then fed to an X-axis deflection circuit 73 and Y-axis deflection circuit 72 of a cathode ray tube 74, to thereby drive a beam deflection system 75. Assuming that the signal $E_s$ is a saw tooth-wave signal of a high frequency and the angular signal $\phi$ is varied slowly at a constant speed over a range of 0° to 360°, there will appear on the display screen of the cathode ray tube the linear images which extend radially from the center of a circle to the circumference thereof and are progressively rotated, as is illustrated in FIG. 14*a*. The beam of this kind can be used as a sweeping beam for a PPI radar system. On the other hand, if the angular signal $\phi$ is varied very rapidly with a saw tooth-wave signal of a low frequency employed as the signal $E_s$, a spiral sweeping image such as shown in FIG. 14*b* can be produced. Such image may be useful in the display for a sonar system. According to invention, it can also be easily accomplished to produce a circle of any given diameter on the screen of a cathode ray tube or the like display.

Figure 15:
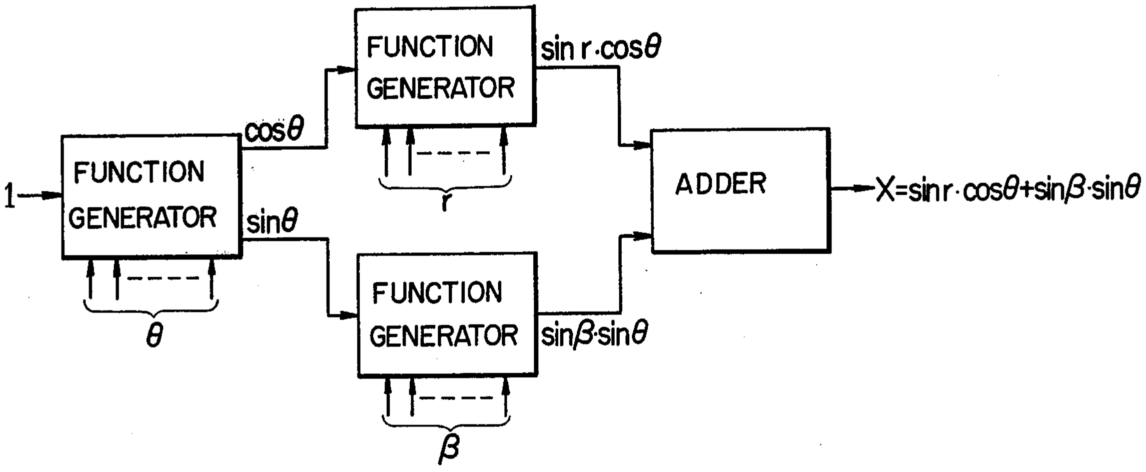
FIG. 15 is a block diagram of a triangular function computing apparatus employing the principle of the invention.

It is further added that the function generator according to the invention can be utilized as a triangular function computing apparatus. For example, for obtaining the following function $$X = \text{sir}\ \gamma \cos\theta + \sin\theta \cdot \sin\beta \qquad (48)$$

a plurality of the function generators according to the invention together with an adder may be connected in such arrangement as shown in FIG. 15. The function generator according to the invention can be applied for the computation of triagular functions like a conventional electromechanical resolver. The difference merely resides in that the angular signal inputs are fed digitally to the function generator according to the invention, while in the case of the electromechanical resolver the angular signal is supplied as a mechanical rotation angle.

I claim:

1. A function generator comprising an amplifier having a feed-back path, means for adding together the output of said amplifier and a reference analog signal, means for producing a product of the result of said addition and an angular input signal representative of one of $\phi$ and $(90° - \phi)$, means for adding together said product and said analog reference signal, and means for applying the result of the last mentioned addition to the input of said amlifier having said feed-back path, whereby a function in a form of one one of $$\frac{1 + (A+B)\phi}{1 + A\phi} \text{ and } \frac{1 + (A+B)(90° - \phi)}{1 + A(90° - \phi)}$$

is obtained.

2. A function generator comprising:

a first function generator supplied with an angular signal $\phi$ at an input thereof and producing at outputs thereof functions $$f_1(\phi) = \frac{K'(90° - \phi)}{1 + K(90° - \phi)} \text{ and } f_2(\phi) = \frac{K'\phi}{1 + K\phi}$$

in which K and K′ are given constants and in which the ratio $f_2(\phi)/f_1(\phi)$ approximates tan $\phi$; and a second function generator connected in series with said first function generator and producing one of the functions $$1 + \frac{B\phi}{1 + A\phi} \text{ and } 1 + \frac{B(90° - \phi)}{1 + A(90° - \phi)}$$

in which A and B are given constants, said function produced by said second function generator approximating the function $$\frac{1}{\sqrt{f_1^2(\phi) + f_2^2(\phi)}},$$

thereby generating at the outputs of said function generator functions approximating to cos $\phi$ and sin $\phi$ or a circular function of a substantially constant vector lenght.

3. A function generator according to claim 2, wherein said second function generator comprises an amplifier having a feedback path, an adder, and a resistor-switch ladder-type network, connected with one another as to add together the output of said amplifier and a reference signal, the result of said addition being supplied to said resistor-switch network, to turn-on or turn-off the switches of said resistor-switch network by one of the angular signal $\phi$ and $90° - \phi$ of a digital quantity, in order to produce a product of said result of said addition and said one angular signal, and said product being the input of said amplifier, whereby a signal representative of one of $$1 + \frac{B\phi}{1 + A\phi} \text{ and } 1 + \frac{B(90° - \phi)}{1 + A(90° - \phi)}$$

is produced at the output of said amplifier.

4. A function generator comprising, in combination:

a first function generator, having an input receiving an angular signal $\phi$, and producing at outputs thereof signals representative of the functions $$f_1(\phi) = \frac{K'(90° - \phi)}{1 + K(90° - \phi)}$$

and $$f_2 = \frac{K'\phi}{1 + K\phi},$$

wherein K and K′ are constants and the ratio $f_2(\phi)/f_2(\phi)$ approximates tan $\phi$; and a second function generator, connected in series with said first function generator, for correcting variations in the vector length of the functions $f_1(\phi)$ and $f_2(\phi)$, and including means for multiplying the signals representative of the functions $f_1(\phi)$ and $f_2(\phi)$ by a signal representative of a function $$f_3 = \frac{K''}{\sqrt{f_1^2(\phi) + f_2^2(\phi)}},$$

where K'' is a constant and thereby producing at outputs thereof signals representative of functions approximating cos ($\phi$) and sin ($\phi$) or a circular function of a substantially constant vector length.

5. A function generator according to claim 4, wherein said second function generator comprises means for generating signals representative of one of $$1 + \frac{B\phi}{1 + A\phi} \text{ and } 1 + \frac{B(90° - \phi)}{1 + A(90° - \phi)},$$

wherein A and B are constants, so as to approximate said third function $$f_3 = \frac{K''}{\sqrt{f_1^2(\phi) + f_2^2(\phi)}}$$

and thereby correct variations in the functions $f_1(\phi)$ and $f_2(\phi)$.

6. A function generator comprising, in combination:

a multiplier type digital-to-analog converter having a plurality of inputs to which are applied digital signals representative of one of an angular siangl $\phi$ and ($90° - \phi$) and an output;

first means, connected to the output of said converter, for inverting the polarity of and multiplying the analog signal output of said converter by a prescribed coefficient;

an adder having a first input connected to the output of said first means and a second input receiving a reference analog signal, the signals at said first and second inputs being added together and produced at the output of said adder, the output of said adder being supplied as an input of said digital to analog converter; and an inverting amplifier connected to the output of said first means generating a correcting output signal representative of one of the functions $$1 + \frac{B\phi}{1 + A\phi} \text{ and } 1 + \frac{B\ (90° - \phi)}{1 + A\ (90° - \phi)}.$$

7. A function generator according to claim 6, further comprising impedance means for coupling the output of said digital to analog converter to the second input of said adder.

* * * * *